US008540920B2

(12) United States Patent
Mazumder et al.

(10) Patent No.: US 8,540,920 B2
(45) Date of Patent: *Sep. 24, 2013

(54) METHODS OF MAKING AN ARTICLE OF SEMICONDUCTING MATERIAL ON A MOLD COMPRISING PARTICLES OF A SEMICONDUCTING MATERIAL

(75) Inventors: Prantik Mazumder, Ithaca, NY (US); Sergey Potapenko, Painted Post, NY (US); Natesan Venkataraman, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 678 days.

This patent is subject to a terminal disclaimer.

(21) Appl. No.: 12/466,104

(22) Filed: May 14, 2009

(65) Prior Publication Data

US 2010/0291380 A1 Nov. 18, 2010

(51) Int. Cl.
*B29D 7/00* (2006.01)
*C01B 33/00* (2006.01)
*C04B 35/00* (2006.01)

(52) U.S. Cl.
USPC ........... 264/306; 264/104; 264/215; 264/301; 423/324

(58) Field of Classification Search
None
See application file for complete search history.

(56) References Cited

U.S. PATENT DOCUMENTS

| | | | |
|---|---|---|---|
| 3,948,650 A | 4/1976 | Flemings et al. | 75/135 |
| 4,112,135 A | 9/1978 | Heaps et al. | 427/11 |
| 4,128,680 A | 12/1978 | Heaps et al. | 428/137 |
| 4,137,355 A | 1/1979 | Heaps et al. | 428/201 |
| 4,243,472 A | 1/1981 | O'Neill | 156/624 |
| 4,251,570 A | 2/1981 | Zook | 427/74 |
| 4,447,289 A | 5/1984 | Geissler et al. | 156/608 |
| 4,778,478 A | 10/1988 | Barnett | 437/5 |
| 5,380,372 A * | 1/1995 | Campe et al. | 136/258 |
| 5,712,199 A | 1/1998 | Nakagawa et al. | 438/62 |
| 6,231,667 B1 | 5/2001 | Iwane et al. | 117/55 |
| 6,413,313 B1 * | 7/2002 | Yoshida et al. | 117/200 |
| 6,581,415 B2 | 6/2003 | Chandra et al. | 65/66 |
| 6,596,075 B2 | 7/2003 | Igarashi et al. | 117/26 |
| 6,682,990 B1 | 1/2004 | Iwane et al. | 438/458 |
| 6,746,225 B1 | 6/2004 | McHugh | 425/130 |
| 6,802,900 B2 | 10/2004 | Iwane et al. | 117/54 |
| 6,946,029 B2 | 9/2005 | Tsukuda et al. | 117/16 |
| 7,071,489 B2 | 7/2006 | Tsukuda | 257/75 |
| 7,111,476 B2 | 9/2006 | Loxley et al. | 65/17.2 |
| 7,186,578 B2 | 3/2007 | Goma et al. | 438/22 |
| 7,294,197 B1 | 11/2007 | Gralenski | 117/37 |

(Continued)

FOREIGN PATENT DOCUMENTS

| | | |
|---|---|---|
| EP | 1085559 A2 | 9/2000 |
| EP | 1113096 | 12/2000 |

(Continued)

OTHER PUBLICATIONS

Tomoyuki, Takakura et al., "Effect of Rapid Thermal Process for CDS Silicon Solar Cell," poster, Sharp, Japan.

(Continued)

*Primary Examiner* — Benjamin Schiffman

(74) *Attorney, Agent, or Firm* — Michael W. Russell

(57) ABSTRACT

The invention relates to methods of making articles of semiconducting material and semiconducting material articles formed thereby, such as articles of semiconducting material that may be useful in making photovoltaic cells.

20 Claims, 4 Drawing Sheets

(56) References Cited

U.S. PATENT DOCUMENTS

| | | | |
|---|---|---|---|
| 7,601,618 B2* | 10/2009 | Drevet et al. | 438/486 |
| 7,771,643 B1* | 8/2010 | Cook et al. | 264/305 |
| 8,246,745 B2* | 8/2012 | Schonecker et al. | 117/56 |
| 2001/0004874 A1* | 6/2001 | Igarashi et al. | 117/11 |
| 2002/0092464 A1 | 7/2002 | Nakagawa et al. | 117/94 |
| 2003/0140859 A1 | 7/2003 | Ukiyo et al. | 118/726 |
| 2009/0004835 A1* | 1/2009 | Drevet et al. | 438/486 |
| 2009/0044925 A1* | 2/2009 | Schonecker et al. | 164/77 |
| 2010/0290946 A1* | 11/2010 | Cook et al. | 420/555 |
| 2010/0291380 A1 | 11/2010 | Mazumder et al. | 428/338 |
| 2010/0295061 A1* | 11/2010 | Sachs et al. | 257/77 |
| 2011/0033643 A1* | 2/2011 | Cook et al. | 428/34.6 |
| 2011/0101281 A1* | 5/2011 | Cook et al. | 252/500 |
| 2011/0135902 A1* | 6/2011 | Mazumder et al. | 428/220 |
| 2012/0129293 A1* | 5/2012 | Potapenko et al. | 438/89 |

FOREIGN PATENT DOCUMENTS

| | | |
|---|---|---|
| EP | 2014802 | 1/2009 |
| JP | 60-213351 A | 10/1985 |
| WO | WO 2005/104244 A1 | 11/2005 |
| WO | WO 2009/002550 A1 | 12/2008 |
| WO | WO2009/108358 A1 | 9/2009 |

OTHER PUBLICATIONS

Mitsuyasu, Hidemi et al., "Characteristics of CDS Silicon Wafers," poster, Sharp, Japan.

Li, J.G. and Hausner, H., "Wetting and adhesion in liquid silicon/ceramic systems," Materials Letters, 14 (1992), pp. 329-332.

Turnbull, D., "Formation of Crystal Nuclei in Liquid Metals," Journal of Applied Physics, 21 (Oct. 1950), pp. 1022-1028.

Turnbull, D., "Kinetics of Heterogeneous Nucleation," Journal of Chemical Physics, vol. 18, No. 2 (Feb. 1950), pp. 198-203.

Turnbull, D. and Fischer, J.C., "Rate of Nucleation in Condensed Systems," Journal of Chemical Physics, vol. 17, No. 1 (Jan. 1949), pp. 71-73.

Bell, R. O., and Kalejs, J. P., "Growth of silicon sheets for photovoltaic applications," *Journal of Materials Research*, received Mar. 2, 1998, pp. 2732-2739, vol. 13, No. 10, Oct. 1998.

Hide, et al "Mould Shaping Silicon Crystal Growth With A Mould Coating Material By The Spinning Method," J. of Crystal Growth 79 (1986) 583-589.

* cited by examiner

METHODS OF MAKING AN ARTICLE OF SEMICONDUCTING MATERIAL ON A MOLD COMPRISING PARTICLES OF A SEMICONDUCTING MATERIAL

FIELD

The invention relates to methods of making an article of semiconducting material and the resulting article, such as articles of semiconducting material that may be useful in making photovoltaic cells.

BACKGROUND

Semiconducting materials find uses in many applications. For example, semiconducting materials can be used in electronic devices as processors formed on semiconductor wafers. As a further example, semiconducting materials may also be used to convert light radiation into electrical energy through the photovoltaic effect.

The semiconducting properties of a semiconducting material may depend on the crystal structure of the material. Dopants, impurities and other defects may affect the resulting properties. Trace amounts of transition metals, oxygen, or carbon, for example, may affect conductivity or carrier lifetime.

The grain size and shape distribution often play an important part in the performance of semiconducting devices. Generally, a larger and more uniform grain size is desirable for semiconducting devices. For example, the electrical conductivity and efficiency of photovoltaic cells may be improved by increasing both the grain size and the uniformity of the grains.

For silicon-based solar photovoltaic cells, the silicon can be formed, for example, as an unsupported ingot, sheet or ribbon, or supported by forming the silicon on a substrate. Conventional methods for making unsupported and supported articles of semiconducting materials, such as silicon sheets, have several shortcomings.

Methods of making unsupported, i.e., without an integral substrate, thin semiconducting material sheets may be slow or wasteful of the semiconducting material feedstock. Methods by which unsupported single crystalline semiconducting materials are made include, for example, the Czochralski process, which may lead to significant kerf loss when the material is cut into thin sheets or wafers. Additional methods by which unsupported multicrystalline semiconducting materials are made include, for example, electromagnetic casting and ribbon growth techniques, which may be slow, producing about 1-2 cm/min for polycrystalline silicon ribbon growth technologies.

Supported semiconducting material sheets may be made less expensively, but the thin semiconducting material sheet may be limited by the substrate on which it is made, and the substrate may have to meet various process and application requirements, which may be conflicting.

Thus, there is a long-felt need in the industry for a method to make articles of semiconducting materials, which method may improve crystal grain structure, reduce the amount of impurities and defects, and reduce material waste, and/or increase the rate of production.

Useful methods for producing unsupported multicrystalline semiconducting material are disclosed in commonly-owned U.S. Provisional Patent Application No. 61/067,679, filed Feb. 29, 2008, titled "METHOD OF MAKING AN UNSUPPORTED ARTICLE OF A PURE OR DOPED SEMICONDUCTING ELEMENT OR ALLOY," and U.S. Patent Application No. PCT/US09/01268, filed Feb. 27, 2009, titled "METHODS OF MAKING AN UNSUPPORTED ARTICLE OF PURE OR DOPED SEMICONDUCTING ELEMENT OR ALLOY," the disclosures of which are hereby incorporated by reference.

As described herein, the inventors have now discovered additional methods by which supported and unsupported articles of semiconducting materials may be made.

SUMMARY

In accordance with various exemplary embodiments of the invention are provided methods of making an article of semiconducting material comprising providing a molten first semiconducting material at a temperature $T_S$, providing a mold at a temperature $T_{Mold}$, such that $T_S > T_{Mold}$, coating at least one discrete location of an external surface of the mold with particles of a semiconducting material, immersing the mold in the molten semiconducting material for a period of time sufficient to form a solid layer at least partially comprised of the first semiconducting material over the external surface of the mold, and withdrawing the mold with the solid layer from the molten first semiconducting material. In various embodiments, the methods may further comprise separating the solid layer from the mold to form an unsupported article of the semiconducting material.

Other exemplary embodiments of the invention relate to methods of making an article of semiconducting material comprising providing a molten first semiconducting material at a temperature $T_S$, providing a mold at a temperature $T_{Mold}$, such that $T_S > T_{Mold}$, wherein the mold comprises a principle substrate having an external surface and at least one discrete location comprised of a second semiconducting material, immersing the mold in the molten first semiconducting material for a period of time sufficient to form a solid layer at least partially comprised of the first semiconducting material over an external surface of the mold, and withdrawing the mold with the solid layer from the molten first semiconducting material. In various embodiments, the methods may further comprise separating the solid layer from the mold to form an unsupported article of the semiconducting material.

Other exemplary embodiments of the invention relate to methods of controlling grain nucleation and/or crystal growth of an article of semiconducting material comprising providing a molten first semiconducting material at a temperature $T_S$, providing a mold at a temperature $T_{Mold}$, such that $T_S > T_{Mold}$, coating at least one discrete location of an external surface of the mold with particles of a second semiconducting material, immersing the mold in the molten first semiconducting material for a period of time sufficient for a solid layer at least partially comprised of the first semiconducting material to form over an external surface of the mold and begin to remelt, and withdrawing the mold with the solid layer from the molten first semiconducting material. In various embodiments, the methods may further comprise separating the solid layer from the mold to form an unsupported article of the semiconducting material.

Exemplary embodiments of the invention also relate to articles of semiconducting material formed by any of the methods described herein.

Further exemplary embodiments of the invention relate to molds for forming articles of semiconducting material, wherein the mold comprises an external surface and particles of a semiconducting material on at least one discrete location of the external surface of the mold.

The methods according to the present invention may, in at least some embodiments, improve crystal grain structure of the article of semiconducting material, reduce the amount of impurities and/or the amount of defects in the article of semiconducting material, reduce material waste, and/or increase the rate of production of the semiconducting material.

As used herein, the term "semiconducting material" includes materials that may exhibit semiconducting properties, such as, for example, silicon, alloys and compounds of silicon, germanium, alloys and compounds of germanium, alloys and compounds of tin, gallium arsenide, alloys and compounds of gallium arsenide, and mixtures thereof. In various embodiments, the semiconducting material may be pure (such as, for example, intrinsic or i-type silicon) or doped (such as, for example, silicon containing at least one n-type or p-type dopant, such as phosphorous or boron, respectively).

As used herein, the phrase "article of semiconducting material" includes any shape or form of semiconducting material made using the methods of the present invention. Examples of such articles include articles that are smooth or textured; articles that are flat, curved, bent, or angled; and articles that are symmetric or asymmetric. Articles of semiconducting materials may comprise forms such as, for example, sheets or tubes.

As used herein, the term "unsupported" means that an article of semiconducting material is not integral with a mold. The unsupported article may be connected to the mold while it is being formed, but is separated from the mold after it is formed over the mold. The unsupported article may, however, be subsequently applied on a substrate for various applications, such as photovoltaic applications.

As used herein, the term "supported" means that an article of semiconducting material is integral with a mold. The supported article may remain on the mold for further processing, after which the article of semiconducting material may or may not be removed from the mold, or the mold may act as a support or substrate for the article of semiconducting material.

As used herein, the term "mold" means a physical structure that can influence the final shape or structure of the article of semiconducting material. Molten or solidified semiconducting material need not actually physically contact a surface of the mold in the methods described herein, although contact may occur between a surface of the mold and the molten or solidified semiconducting material.

As used herein, the term "external surface of the mold" means a surface of the mold that may be exposed to a molten semiconducting material upon immersion. For example, an interior surface of a tube-shaped mold may be an external surface if the interior surface can contact a molten semiconducting material when the mold is immersed.

As used herein, the phrase "at least one discrete location of an external surface of the mold" and variations thereof mean at least one localized area, but not all of the area on the external surface of the mold. For example, the at least one discrete location of the external surface of the mold may comprise contiguous or non-contiguous locations, one or more locations on the periphery of the mold, locations not on the periphery of the mold, the leading edge of the mold, and combinations thereof. When the at least one discrete location of the external surface of the mold comprises more than one location on the external surface of the mold, the discrete locations may be randomly positioned or may form a regular pattern.

As used herein, the phrase "coating the at least one discrete location of the external surface of the mold with particles of semiconducting material" and variations thereof mean that particles of semiconducting material are applied, coated, affixed, or otherwise attached to or placed on the at least one discrete location of the external surface of the mold by any method known to those of skill in the art. The particles need not form a contiguous or continuous coating or layer on the at least one discrete location. In at least one exemplary embodiment, coating the at least one discrete location may comprise placing a single particle of semiconducting material on the at least one discrete location.

As used herein, the phrase "first semiconducting material" is used to identify the semiconducting material of the molten semiconducting material. Therefore, the phrase "molten semiconducting material" is used interchangeably with the phrase "molten first semiconducting material."

As used herein, the phrase "second semiconducting material" is used to identify the semiconducting material of the at least one discrete location of the mold. Therefore, the phrase "at least one discrete location comprised of a semiconducting material" and variations thereof is used interchangeably with the phrase "at least one discrete location comprised of a second semiconducting material" and variations thereof. The second semiconducting material may, in various embodiments, comprise particles of semiconducting material, including a single particle of semiconducting material at each of the at least one discrete locations, or a plurality of particles at each of the at least one discrete location. In other embodiments, the second semiconducting material at the at least one discrete location may be integral with the material comprising the mold, such as in embodiments where the at least one discrete location is formed by etching a native oxide layer covering the mold to form the at least one discrete location. According to various embodiments, the first and second semiconducting materials may comprise substantially the same or different semiconducting materials. When the first and second semiconducting materials are substantially the same, at least one of the first and second semiconducting materials may further comprise at least one additional component, such as, for example, a dopant.

As used herein, the phrase "form a solid layer at least partially comprised of the first semiconducting material over an external surface of the mold" and variations thereof mean that at least some of the first semiconducting material from the molten semiconducting material solidifies (also referred to herein as freezing or crystallizing) on or near an external surface of the mold. The phrases "solid layer at least partially comprised of the first semiconducting material," "solid layer of semiconducting material," and "solid layer" are used interchangeably to identify the layer at least partially comprised of the first molten semiconducting material that solidifies over the external surface of the mold. The solid layer may, in various embodiments, also comprise the second semiconducting material, for example if the second semiconducting material partially melts in the molten first semiconducting material and then refreezes.

In various other embodiments, the solid layer of semiconducting material may also comprise at least one dopant if at least one of the molten first semiconducting material and the second semiconducting material comprise at least one dopant. Forming a solid layer of semiconducting material over an external surface of the mold may, in some embodiments, include solidifying semiconducting material on a plurality of particles that coat the external surface of the mold. In various embodiments, due to the temperature difference between the mold and the molten semiconducting material, the semiconducting material may solidify before it physically contacts the surface of the mold. When the semiconducting material solidifies before it physically contacts the mold, the solidified semiconducting material may, in some embodiments, subsequently come into physical contact with the mold or with particles coating the mold. The semiconducting material may, in some embodiments, also solidify after physically contacting the external surface of the mold, or particles coating the surface of the mold, if present.

As used herein, the phrase "reduce the amount of impurities in the article of semiconducting material" and variations thereof include any reduction in the presence of impurities, which include any undesired materials or any materials other than dopants and the semiconducting material, with respect to conventional methods for producing semiconducting material articles.

As used herein, the phrase "reduce the amount of defects in the article of semiconducting material" and variations thereof include any reduction in the amount of defects present in the crystal structure of the article of semiconducting material, such as, for example, dislocations and grain boundaries, with respect to conventional methods for producing semiconducting material articles.

As used herein, the phrase "increased rate of production" and variations thereof include any increase in the rate of semiconducting material article production with respect to conventional methods for producing semiconducting material, such as ribbon growth methods. For example, an increased rate of production may be any rate greater than 1-2 cm/min.

As used herein, the phrase "reduced material waste" and variations thereof mean any reduction in the amount of semiconducting material lost through conventional methods using slicing or cutting following production of the article of semiconducting material.

As used herein, the term "crystalline" means any material comprising a crystal structure, including, for example, single crystalline and multicrystalline semiconducting materials.

As used herein, the term "multicrystalline" includes any material comprised of a plurality of crystal grains. For example, multicrystalline materials may include polycrystalline, microcrystalline, and nanocrystalline materials.

As used herein, the terms, "temperature of the molten semiconducting material," "bulk temperature of the molten semiconducting material," and variations thereof mean the average temperature of the molten semiconducting material contained within the vessel. Localized temperatures within the molten semiconducting material may vary spatially at any point in time, such as, for example, areas of the molten semiconducting material close to the mold when the mold is immersed, or molten semiconducting material exposed to the atmospheric conditions at the top surface of the vessel. In various embodiments, the average temperature of the molten semiconducting material is substantially uniform despite any localized temperature variation.

As used herein, the term "undercooling" refers to a process in which a temperature difference is generated between the molten semiconducting material and the mold which may cause solidification of the molten semiconducting material, and the amount of undercooling may be measured in degrees Kelvin (K) or Celsius (° C.).

As described herein, the invention relates to methods of making articles of semiconducting material and semiconducting material articles formed thereby. In the following description, certain aspects and embodiments will become evident. It should be understood that the invention, in its broadest sense, could be practiced without having one or more features of these aspects and embodiments. It should be understood that these aspects and embodiments are merely exemplary and explanatory, and are not restrictive of the invention as claimed.

BRIEF DESCRIPTION OF DRAWINGS

The following figures, which are described below and which are incorporated in and constitute a part of the specification, illustrate exemplary embodiments of the invention and are not to be considered limiting of the scope of the invention, for the invention may admit to other equally effective embodiments. The figures are not necessarily to scale, and certain features and certain views of the figures may be shown exaggerated in scale or in schematic in the interest of clarity and conciseness.

DETAILED DESCRIPTION

It is to be understood that both the foregoing general description and the following detailed description are exemplary and explanatory only, and are not restrictive of the invention. Other embodiments of the invention will be apparent to those skilled in the art from consideration of the specification and practice of the invention disclosed herein. It is intended that the specification be considered as exemplary only.

Figure 1:
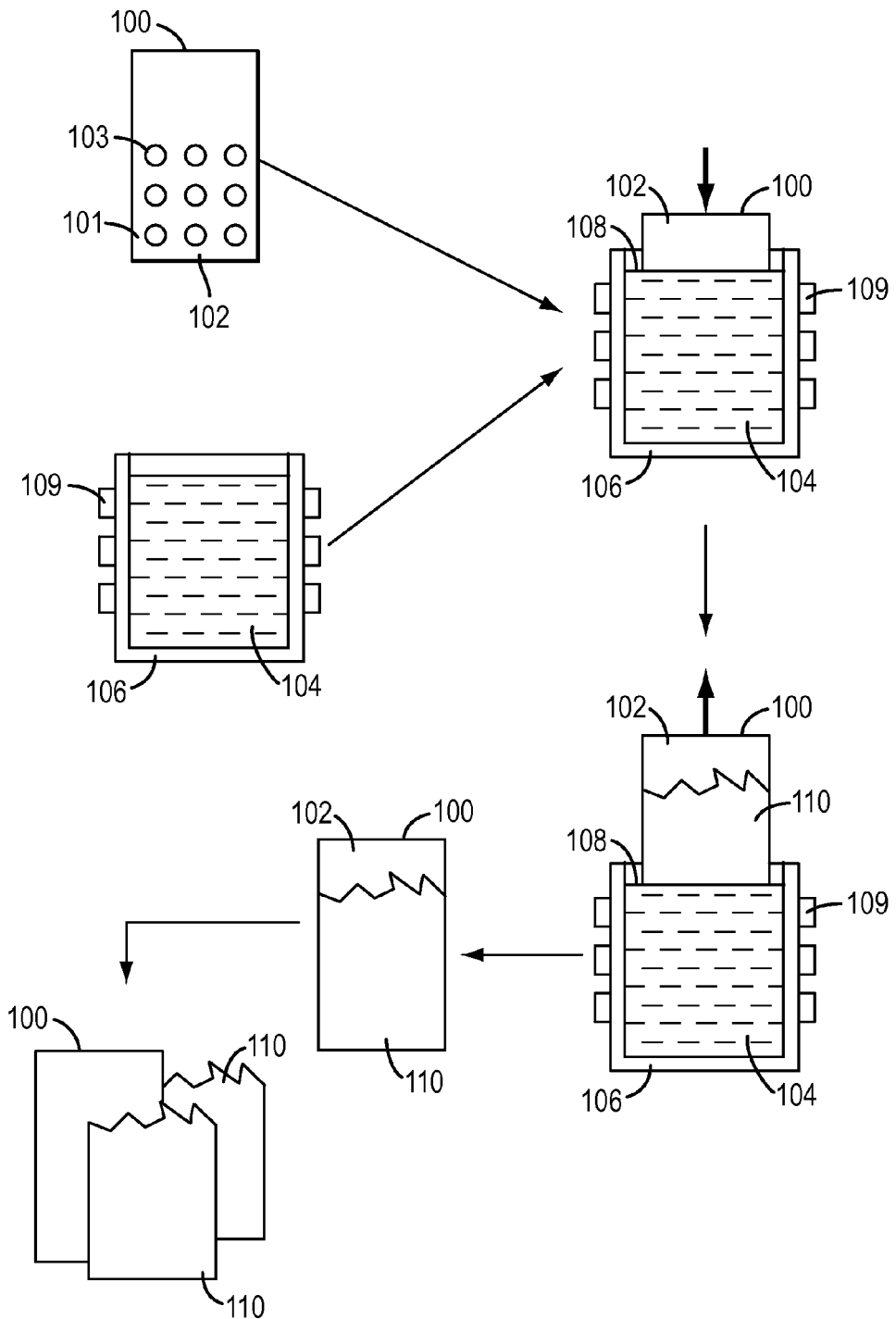
FIG. 1 is a schematic illustration of an exemplary method of making an unsupported article of semiconducting material according to an embodiment.

FIG. 1 illustrates an exemplary method of making an unsupported article of a semiconducting material. A method similar to that illustrated in FIG. 1 can be used to make a supported article, for example by ending the process before the final separation step.

The exemplary method depicted schematically in FIG. 1 is an exocasting process, which casts an article on a surface, such as an external surface, of a mold, rather than filling a mold cavity. As shown in FIG. 1, mold 100 is provided having an external surface 102 with a desired size, surface area, shape, and surface texture/pattern. The surface area, shape, and surface texture/pattern of the external surface 102 of the mold 100 may determine the size, shape, and surface texture/pattern of the cast article. One of ordinary skill in the art would recognize that the size, shape, and surface texture/pattern of the external surface 102 of the mold 100 can be selected based on, for example, the desired properties and features of the cast article.

In at least one embodiment, mold 100 is formed of a material that is compatible with molten semiconducting material 104. For example, mold 100 may comprise a material such that when mold 100 is exposed to the molten semiconducting material 104, mold 100 does not react with the molten semiconducting material 104 in a manner that interferes with the methods disclosed herein, such as, for example, by forming a low-melting compound or solid solution. As a further example, mold 100 may comprise a material that does not melt or soften when mold 100 is heated via contact with the molten semiconducting material 104. As a further example, mold 100 may comprise a material that does not become too fluid to support the solid layer 110 and/or does not separate from the solid layer 110 when mold 100 is heated via contact with the molten semiconducting material 104. As a further example, mold 100 may comprise a material such that when mold 100 is heated via contact with the molten semiconducting material 104, mold 100 does not check, fracture, or explode due to, for example, large thermal stresses generated from uneven, rapid thermal expansion, or from trapped gases. As yet a further example, mold 100 may comprise a material that does not deleteriously contaminate or introduce undesirable impurities to either the solid layer 110 being formed on the mold or the molten semiconducting material 104 residuum via breakage, spallation, dusting, and diffusion of vapor or liquid phases of solid components or evolved gases. In at least one embodiment, mold 100 may comprise a material chosen from fused silica, graphite, silicon nitride, monocrystalline or multicrystalline silicon, and combinations thereof. In at least one embodiment, mold 100 is made of fused silica. In at least one other embodiment, mold 100 is made of monocrystalline or multicrystalline silicon optionally covered in native oxide. The optional native oxide may be continuous or discontinuous.

Molten semiconducting material 104 such as, for example, molten silicon, may in at least one embodiment be provided by melting silicon in a vessel, such as a crucible 106, which may optionally be non-reactive with the silicon. In at least one embodiment, molten semiconducting material 104 may have low contaminant levels. For example, molten semiconducting material 104 may comprise less than 1 ppm of iron, manganese, and chromium, and/or less than 1 ppb of vanadium, titanium, and zirconium. Molten semiconducting material 104 may also comprise less than $10^{15}$ atoms/cm$^3$ of nitrogen and/or less than $10^{17}$ atoms/cm$^3$ of carbon. In at least one embodiment, the source of the semiconducting material may be photovoltaic-grade or purer silicon.

In one exemplary embodiment of the invention, mold 100 may be brought to a temperature, $T_{Mold}$, optionally in a low oxygen or reducing atmosphere using any suitable heating device or method. Examples of suitable heating devices and methods include heating elements, such as resistive or inductive heating elements, infrared (IR) heat sources (e.g., IR lamps), and a flame heat source. In at least one embodiment, mold 100 is brought to a temperature, $T_{Mold}$, by at least one IR lamp. One skilled in the art would recognize that the choice of heating device or method may be made based on factors such as, for example, the environment in which the mold is heated, the material of the mold, the thickness of the mold, and/or the desired level of contaminants in the final article produced.

In at least one embodiment, the molten semiconducting material 104 may be brought to a bulk temperature, $T_S$, optionally in a low oxygen or reducing atmosphere using any suitable heating device or method. As described above, suitable heating devices and methods include heating elements and a flame heat source. In at least one embodiment, molten semiconducting material 104 is heated using an induction heat source. As described above, one skilled in the art would recognize that the choice of a heat source depends on several factors such as, for example, the capacity of the vessel containing the molten semiconducting material, the size/thickness of the vessel, and/or the atmosphere surrounding the vessel.

Prior to immersion, the temperature of the mold, $T_{Mold}$, may be less than the bulk temperature of the molten semiconducting material, $T_S$, to establish a temperature difference between the mold 100 and the molten semiconducting material 104 that may drive the solidification process. In various embodiments, the bulk temperature of molten semiconducting material, $T_S$, may be the melting temperature of the molten semiconducting material, or may be a higher temperature. In one exemplary embodiment where the molten semiconducting material comprises silicon, the bulk temperature of the molten silicon, $T_S$, may range from 1414° C. to 1550° C., such as, for example, from 1450° C. to 1490° C., such as 1460° C.

Figure 2:
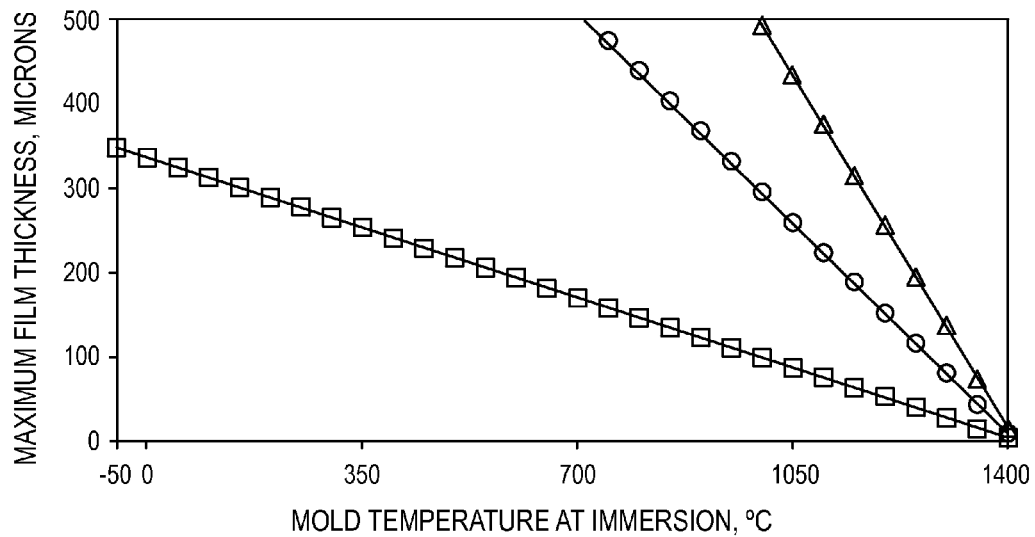
FIG. 2 is a graph illustrating the relationship between the mold temperature at the time of immersion and the maximum thickness of a silicon film for various mold thicknesses according to an embodiment.

In at least one embodiment, the temperature of the mold, $T_{Mold}$, may, for example, be chosen so that the mold 100 is able to cool the molten semiconducting material adjacent the surface of mold 100 to the solidifying/freezing point of the molten semiconducting material 104, and to remove sufficient heat from the molten semiconducting material 104 to freeze it. In at least one embodiment, the temperature of the mold, $T_{Mold}$, may be chosen based, at least in part, on the thickness of mold 100. For example, as can be determined from the data presented in FIG. 2, a thicker mold may have the capacity to produce a thicker article of semiconducting material than a thinner mold when both molds have the same temperature at the time of immersion in the molten semiconducting material 104. The data shown in FIG. 2 is exemplary of one embodiment only, and as one of skill in the art will recognize, the maximum film thickness will depend on, for example, the mold material, the molten semiconducting material, and the temperatures of the mold and molten semiconducting material.

In at least one embodiment, the temperature of the mold, $T_{Mold}$, may range from –50° C. to 1400° C. prior to immersion in the molten semiconducting material 104. For example, in at least one embodiment, the temperature of the mold, $T_{Mold}$, may range from –35° C. to 0° C. prior to immersion in the molten semiconducting material 104. In a further embodiment, the temperature of mold, $T_{Mold}$, may range from 20° C. to 30° C. prior to immersion in the molten semiconducting material 104. In yet a further embodiment, the temperature of the mold, $T_{Mold}$, may range from 300° C. to 500° C. prior to immersion in the molten semiconducting material 104. The difference between the temperature of the mold, $T_{Mold}$, prior to immersion and the bulk temperature of the molten semiconducting material, $T_S$, is approximately equal to the amount of undercooling. In at least one embodiment, mold 100 may be provided at a temperature, $T_{Mold}$, by heating the mold 100 at a location above the molten semiconducting material.

Figure 5:
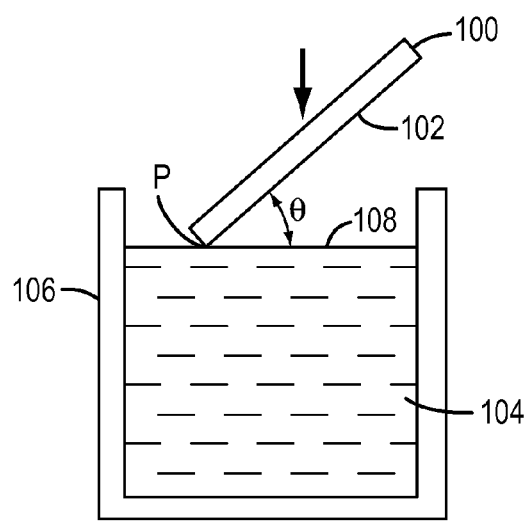
FIG. 5 is a schematic representation of an exemplary immersion angle of a mold as it is immersed in molten semiconducting material.

According to at least one embodiment, as shown in FIG. 1, mold 100 may be immersed in the molten semiconducting material 104 at a predetermined rate, optionally in a low oxygen or reducing atmosphere. Mold 100 may be immersed in molten semiconducting material 104 at any immersion angle θ, where immersion angle θ is the angle between the surface 108 of molten semiconducting material 104 and the external surface 102 of mold 100 at the point P that first contacts the surface 108 of molten semiconducting material 104 as shown in FIG. 5. The angle at which external surface 102 of mold 100 contacts molten semiconducting material 104 may vary as mold 100 is immersed in molten semiconducting material 104. By way of example only, in one embodiment, molten semiconducting material could contact a mold having a spherical external surface at an infinite number of angles as it is immersed, although the immersion angle θ would be 0° as the initial contact point would be parallel to the surface 108 of molten semiconducting material 104. In further exemplary embodiments, mold 100 may be moved in a direction parallel to surface 108 of molten semiconducting material 104 as mold 100 is immersed in a direction perpendicular to surface 108 of molten semiconducting material 104. One skilled in the art would also recognize that the local immersion angle, that is the immersion angle at any finite location at the point P of first contact may also vary due to the surface properties (such as, for example, porosity or height variations) and the wetting angle of the material comprising the mold.

In a further exemplary embodiment, external surface 102 of mold 100 may be substantially perpendicular to the surface 108 of the molten semiconducting material 104, i.e., the immersion angle is approximately 90°. In a further embodiment, the external surface 102 of mold 100 need not be perpendicular to the surface 108 of molten semiconducting material 104. By way of example, the external surface 102 of mold 100 may be immersed in the molten semiconducting material 104 at an immersion angle ranging from 0° to 180°, such as from 0° to 90°, from 0° to 30°, from 60° to 90°, or at an immersion angle of 45°.

In at least one embodiment, immersion of the mold may be accomplished using any suitable technique, and may be accomplished by immersing the mold from above the molten semiconducting material or from the side or bottom of the molten semiconducting material.

In at least one embodiment, mold 100 may be immersed in the molten semiconducting material 104 for a period of time sufficient to allow a layer of the semiconducting material to sufficiently solidify on a surface 102 of mold 100. In at least one embodiment, the semiconducting material is sufficiently solidified when enough semiconducting material has solidified that the mold can be withdrawn from the molten semiconducting material and the layer of solidified semiconducting material will be withdrawn with the mold. By way of example only, the mold 100 may be immersed in the molten semiconducting material 104 for up to 30 seconds or more depending on the thickness of mold 100. In at least one embodiment, the mold 100 may be immersed from 0.5 seconds to 30 seconds, such as up to 10 seconds. By way of example, mold 100 may be immersed in the molten semiconducting material 104 for 1 second to 4 seconds. The immersion time may be varied appropriately based on parameters known to those of skill in the art, such as, for example, the thickness of the mold, the temperatures and heat transfer properties of the mold and the molten semiconducting material, and the desired thickness of the formed article of semiconducting material.

In at least one embodiment, at least one heating element 109, such as resistive heating elements or inductive heating elements, may be used to heat the vessel 106 and/or hold the molten semiconducting material 104 at a desired temperature while mold 100 is immersed. In at least one embodiment, the temperature of the molten semiconducting material 104 may be maintained at the bulk temperature, $T_S$. The molten semiconducting material 104 can be melted and maintained in molten form by any desired method, and the selection of the heating method would be within the skill of one in the art based on the conditions and environment where the method is performed. In at least one embodiment, a reducing environment radio frequency (RF) induction heating may be used. RF induction heating may provide a cleaner environment by minimizing the possibility of the presence of foreign matter in the melt. Induction can also provide the heat flux needed to maintain the desired bulk molten material temperature as the material near the surface of mold 100 extracts heat rapidly.

According to at least one embodiment, mold 100 may be held essentially motionless in the plane parallel to the surface 108 of molten semiconducting material 104 as it is immersed in a direction perpendicular to surface 108 of molten semiconducting material 104. In other embodiments, mold 100 may be moved in the plane parallel to the surface 108 of molten semiconducting material 104, for example rotated or vibrated at any appropriate frequency, when it is immersed in a direction perpendicular to the surface 108 of molten semiconducting material 104. A layer of semiconducting material 110 may form over the surface 102 of mold 100. After immersion, mold 100 with a layer of semiconducting material 110 may be withdrawn from the vessel 106. In at least one embodiment, mold 100 with a layer of semiconducting material 110 may be cooled after it is removed from vessel 106, either actively such as by convective cooling, or by allowing the temperature of the layer of semiconducting material 110 to come to room temperature. After mold 100 is removed from vessel 106 and sufficiently cooled, the solid layer of semiconducting material 110 may be removed or separated from mold 100 by any method known to those of skill in the art. In at least one embodiment, the layer of semiconducting material may be sufficiently cooled when it may be separated or removed from the mold without breaking or deforming. In at least one embodiment, the layer of semiconducting material 110 may be separated or removed from mold 100 by differential expansion and/or mechanical assistance. In at least one embodiment, the solid layer of semiconducting material 110 may remain on mold 100 as a supported article of semiconducting material.

In at least one embodiment, the first and second semiconducting materials may be chosen from silicon, alloys and compounds of silicon, germanium, alloys and compounds of germanium, alloys and compounds of tin, gallium arsenide, alloys and compounds of gallium arsenide, and mixtures thereof. According to various embodiments, the first and/or second semiconducting materials may be pure or doped. In at least one embodiment, the first and/or second semiconducting materials comprise at least one dopant chosen from boron, phosphorous, or aluminum (B, P, or Al). In at least one embodiment, the at least one dopant is present in the part per million (ppm) range. The amount of dopant present in the first and/or second semiconducting material may be chosen based on the desired dopant concentration in the produced article of semiconducting material and may depend on the final use of the article, such as, for example, a photovoltaic cell. According to at least one embodiment, an article of semiconducting material produced by the methods disclosed herein may comprise at least one dopant dispersed substantially homogeneously throughout the semiconducting material (e.g., without substantial segregation of the at least one dopant within the semiconducting material).

In a further embodiment, the first and/or second semiconducting material may comprise at least one non-semiconducting element that may form a semiconducting alloy or compound with another element. For example, the first and/or second semiconducting material may be chosen from gallium arsenide (GaAs), aluminum nitride (AlN), and indium phosphide (InP).

In various embodiments, a number of process parameters may be varied, including but not limited to: (1) the composition, density, heat capacity, thermal conductivity, thermal diffusivity, and thickness of the mold 100, (2) the temperature of the mold, $T_{Mold}$, at which it is provided prior to immersion and the bulk temperature of the molten semiconducting material, $T_S$, (3) the rate at which mold 100 is immersed into the molten material 104, (4) the length of time which mold 100 is immersed in the molten material 104, (5) the rate at which mold 100 having the solid layer of semiconducting material 110 is removed from the molten material 104, and (6) the rate of cooling of the solidified semiconducting material 110.

In at least one embodiment, the temperature of the mold, $T_{Mold}$, at which it is provided prior to immersion and the bulk temperature of the molten semiconducting material, $T_S$, are the only temperature parameters that are controlled (e.g., the temperature of the mold changes upon immersion in the molten semiconducting material while the temperature of the bulk molten semiconducting material is maintained at a constant temperature).

In at least one embodiment, the temperature of mold 100 is not controlled after it is immersed in the molten semiconducting material 104, and thus its temperature is only altered by the temperature of the molten semiconducting material, $T_S$. The temperature of the molten semiconducting material, $T_S$, may alter the temperature of mold 100 through radiation, convection, or conduction. Radiative heating of mold 100 may occur, for example, when mold 100 is above molten semiconducting material 104. Mold 100 may be convectively heated by molten semiconducting material 104 when fumes above molten semiconducting material 104 pass over the surface of mold 100 or during immersion of mold 100 in the molten semiconducting material 104. Heating of mold 100 by conduction may occur, for example, while mold 100 is immersed in molten semiconducting material 104.

Figure 6:
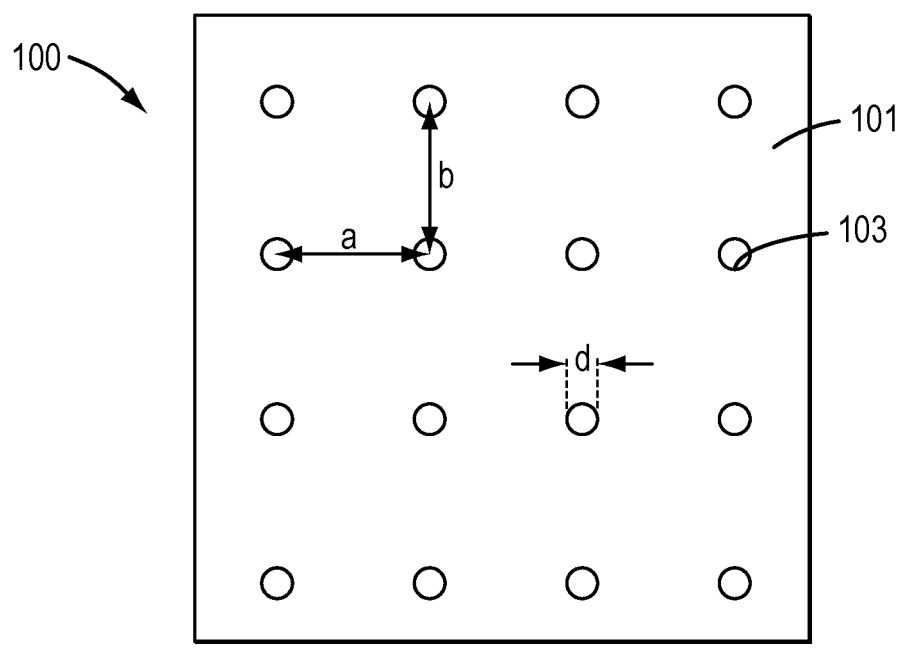
FIG. 6 is a schematic representation of an exemplary mold according to an embodiment of the invention.

According to various embodiments, mold 100 comprises a principle substrate 101 having an external surface 102 and at least one discrete location 103, as shown in FIGS. 1 and 6. Principle substrate 101 may comprise the mold material, such as, for example, fused silica or silicon. The at least one discrete location 103 may comprise a second semiconducting material, which may the same or different as molten first semiconducting material 104. In at least one embodiment, at least one of the first and second semiconducting materials comprises at least one dopant.

According to various embodiments, the at least one discrete location may be formed by processing at least one localized area on the external surface of mold 100. By way of example, the at least one discrete location 103 may be formed by coating particles of a second semiconducting material, such as particles of silicon, on at least one localized area on the surface of mold 100.

In exemplary embodiments where mold 100 comprises monocrystalline or multicrystalline silicon having a native oxide, the at least one discrete location 103 may be formed by exposing silicon at one or more localized areas on the external surface of mold 100 by etching the oxidized surface of the silicon principle substrate 101 with hydrofluoric acid.

When the at least one discrete location 103 comprises a second semiconducting material substantially similar to or the same as molten first semiconducting material 104, it may, in some embodiments, be possible to control the grain nucleation and crystal growth on the mold. By way of example, when a mold 100 comprising a fused silica principle substrate 101 and at least one discrete location 103 comprising silicon particles is immersed in molten silicon, grain nucleation and/or crystal growth may preferentially occur at the at least one discrete location 103 because the molten silicon does not wet as well to the fused silica principle substrate 101. While not wishing to be bound by theory, it is believed that both grain nucleation and epitaxial crystal growth may occur when the at least one discrete location 103 comprises a second semiconducting material similar to the molten first semiconducting material 104. When the amount of undercooling is small, it is believed that the ratio of epitaxial crystal growth to grain nucleation is larger than when the amount of undercooling is large. In at least one embodiment, the amount of undercooling is minimized such that epitaxial crystal growth occurs while providing enough undercooling to form an article of semiconducting material having the desired thickness. One skilled in the art would be able to easily determine the amount of undercooling necessary based on various embodiments and examples disclosed herein.

The second semiconducting material of the at least one discrete location 103 may be formed or otherwise provided by any conventional method. By way of example, in an embodiment where the principle substrate 101 of mold 100 comprises monocrystalline or multicrystalline silicon having a native oxide layer formed on the surface thereof, the at least one discrete location 103 may be defined by removing the native oxide layer with a dilute hydrofluoric acid. In a further exemplary embodiment, particles of silicon or other second semiconducting material may be applied to the at least one discrete location 103 using a masked principle substrate 101. Particles may be applied using any conventional method including, for example, spraying, rubbing, brushing, pouring, dip-coating, chemical vapor deposition, physical vapor deposition, plasma enhanced chemical vapor deposition, or plasma induction deposition. In one embodiment, masked principle substrate 101 comprises at least one opening defining the at least one discrete location 103 that is functionalized with a polymer, such as, for example, polymethyl-methacrylate. Silicon particles, which are also functionalized, may be applied to the principle substrate 101 and adhere to the at least one opening in the mask. Mold 100 may be fired and cleaned before immersion in molten semiconducting material 104 to remove the polymer and any other contaminants. According to another exemplary embodiment, a chemical vapor deposition (CVD) or induction soot gun source can be used to deposit the second semiconducting material in the at least one opening in the mask defining the at least one discrete location 103. Processes similar to ink-jet printing may also be used to deposit the second semiconducting material on the at least one discrete location 103.

In various embodiments, particles of the second semiconducting material may be deposited on the at least one discrete location 103 by fumes generated by the molten first semiconducting material 104. Particles may be deposited on the at least one discrete location 103, for example by masking the remainder of the mold surface. According to at least one embodiment, the at least one discrete location 103 may be coated with particles, for example prior to being immersed or as mold 100 is immersed in the molten semiconducting material 104. In at least one exemplary embodiment, a coating of particles of the first semiconducting material (for example, silicon nanoparticles) may be formed on the at least one discrete location 103 as the mold 100 is situated above the molten first semiconducting material (for example, silicon). In one exemplary embodiment, a condensation process, whereby fumes from the molten semiconducting material condense on the relatively cold external surface 102 of mold 100, may form a coating of nanoparticles on the at least one discrete location 103 ("fume coating"), in which case the particles of the second semiconducting material comprise substantially the same material as the molten first semiconducting material. For example, molten silicon may generate nanoparticulate-laden fumes when heated above the melting temperature of silicon, for example in a range from 1450° C. to 1550° C. In that exemplary embodiment, mold 100 may be exposed to the fumes above the molten silicon for a suitable length of time, such as, for example, 10 seconds to 30 seconds, with mold 100 at a suitable initial starting temperature, such as 100° C., for nanoparticles of the molten silicon to be deposited onto mold 100.

According to at least one embodiment, the particles of semiconducting material deposited on the at least one discrete location 103 may be pure or substantially pure semiconducting particles, e.g., the pure or substantially pure semiconducting particles may have low contaminant levels. Without wishing to be bound by theory, it is believed that the fumes from the molten semiconducting material 104 may be influenced by impurities present in the molten semiconducting material 104, or may combine or interact with impurities present in the material comprising the mold 100, impurities present in the mold 100, and/or materials present in the atmosphere above the molten semiconducting material 104. For example, depending on the impurities present, particles deposited on the at least one discrete location 103 over molten silicon may comprise silicon oxides (SiO and $SiO_2$) or silicon carbide (SiC) in addition to silicon (Si), if such impurities are not otherwise controlled. Thus, in various embodiments, the purity of the particles of semiconducting material deposited on the at least one discrete location 103 by the condensation process may optionally be controlled, for example by providing a molten semiconducting material 104 having a low amount of impurities, providing a mold 100 comprised of the same or substantially the same semiconducting material as the molten semiconducting material 104, providing a mold 100 having a low amount of impurities, and/or reducing the amount of impurities in the atmosphere above the molten semiconducting material 104. By way of example, in at least one embodiment, the condensation process may be carried out in an enclosure having a highly reducing or low oxygen atmosphere, such as, for example, a dry mixture of pure argon with 2.5% hydrogen. In one embodiment, the atmosphere in the enclosure may optionally be scrubbed (e.g., continuously) of water, for example to levels below 1ppm, and of oxygen, for example to levels below 5 ppm. The enclosure may optionally be slightly pressurized, for example to prevent ingress of atmospheric nitrogen. In at least one embodiment, low volatility carbon compounds may also be kept out of the enclosure.

In a further exemplary embodiment, particles may be deposited on the at least one discrete location 103 as the mold 100, which may comprise a mask covering all areas except the at least one discrete location 103, is immersed in molten semiconducting material 104. In yet a further exemplary embodiment, particles of the second semiconducting material may be deposited on the at least one discrete location 103 before mold 100 is immersed and also as mold 100 is being immersed in molten semiconducting material 104. In at least one further embodiment, rather than placing mold 100 in a fume generated by the molten semiconducting material 104, any non-contaminating surface (such as silicon or vitreous silica), that is relatively cold may be held in the fume to collect the particles. The particles may then be applied onto the at least one discrete location 103 in a separate process.

In at least one embodiment, the coating of particles of the second semiconducting material on the at least one discrete location 103 may have a coating thickness ranging from 0.5 nm to 1 mm, such as, for example, from 5 nm to 100 µm. According to various embodiments, the coating may have a thickness approximately equal to the average size of the particles, e.g., a monolayer of particles. In other embodiments, the coating may have a thickness greater than the average size of the particles, e.g. a multilayer of particles. In at least one embodiment, the particles of the second semiconducting material have an average size ranging from 0.5 nm to 100 µm or more in size, such as, for example, from 5 nm to 100 µm. In other embodiments, the particles of the second semiconducting material have an average size ranging from 10 nm to 2 µm. In at least one embodiment, the particles are nanoparticles having an average size of 100 nm or less, such as, for example, 30 nm or less. In at least one embodiment, the size of the at least one discrete location 103 is equal to the average size of the particles. In at least one embodiment, the area of the at least one discrete location 103 ranges from 1 to 10 times the average size of the particles.

The coating of particles in the various embodiments may be continuous or discontinuous and may be a contiguous coating or a non-contiguous coating. In at least one embodiment, the coating of particles may comprise a single particle on the at least one discrete location. The desired properties of the coating of particles may depend on, for example, the size of the particles, the desired crystal/grain properties of the produced article, and the various operating parameters used in the methods of the invention. As such, the determination of the properties of the coating of particles would be within the ability of those skilled in the art.

According to at least one embodiment, mold 100 comprises a plurality of discrete locations 103. The plurality of discrete locations 103 may be arranged in any way, such as uniformly or randomly on the mold 100. In a further embodiment, the density of discrete locations 103 may be graduated from higher density to lower density. The discrete locations 103 may have any shape, including, for example, circles, squares, dots, islands, triangles, lines, random shapes, etc. In the exemplary mold shown in FIG. 6, discrete locations 103 are circular (diameter, d) and spaced a distances a, b from neighboring discrete locations 203.

Without wishing to be bound by any theory, it is hypothesized that epitaxial growth occurs when the second semiconducting material such as particles or exposed semiconducting material at the at least one discrete location are larger than a critical nucleus diameter at a given amount of undercooling. When the size of the second semiconducting material is larger than the diameter of the critical nucleus, there is no significant potential barrier for crystal growth. In other words, nucleation is not required because the second semiconducting material acts as the seed and the molten first semiconducting material 104 may crystallize directly on the second semiconducting material. The area of the second semiconducting material (i.e., the size of the particles or the area of the exposed semiconducting material at the at least one discrete location) should also be large enough that it does not completely melt before freezing of the molten first semiconducting material occurs. One skilled in the art would recognize that the size of the second semiconducting material should be chosen based on the temperature of the mold, $T_{Mold}$, the bulk temperature of molten first semiconducting material, $T_S$, the thickness of the mold, and the heat transfer properties of the molten first semiconducting material, the second semiconducting material, and the mold.

Mold 100 may be in any form suitable for use in the disclosed methods. For example, in at least one embodiment, mold 100 may be in the form of a monolith or in the form of a laminated structure such as a laminated monolith having a thickness ranging from 0.5 mm to 5 mm. In at least one embodiment, mold 100 may comprise more than one material. Mold 100 may comprise a porous or non-porous body, optionally with at least one porous or non-porous coating. In at least one embodiment, mold 100 may also comprise a uniform or non-uniform composition, uniform or non-uniform porosity, or other uniform or non-uniform structural characteristic throughout the mold body. According to at least one embodiment, mold 100 may also be in any shape suitable for use in the disclosed method. For example, mold 100 may comprise one or more flat surfaces or one or more curved surfaces, for example one or more convex or concave surfaces. For example, the one or more flat surfaces may be used to create an article in the shape of a rectangle, and the one or more convex or concave surfaces may be used to create an article in the shape of a lens or a tube.

In at least one embodiment, the thermophysical properties of the material of mold 100 and the thickness of mold 100 may combine to determine the capacity of mold 100 to extract heat from the molten first semiconducting material 104 in near contact with the external surface 102 of mold 100 causing the semiconducting material at or near the mold 100 to solidify, as well as the rate at which the heat may be transferred. Without wishing to be limited by theory, it is believed that the rate at which heat is extracted from the solid layer 110 over the external surface 102 of mold 100 may affect the grain size of the solid semiconducting material layer 110. The temperature difference between mold 100 and molten semiconducting material 104, i.e., the amount of undercooling, may provide a driving force for the liquid-to-solid phase transformation, while the heat transfer properties (conductivity and diffusivity) of mold 100 may set the rate at which the heat could be removed. A larger temperature difference may, in general, provide a larger driving force, which may result in a finer grained material as more energy may be available to surmount the nucleation barrier leading to a greater number of growth sites. A smaller temperature difference may favor the formation of larger grains.

FIG. 2 shows an graphical representation of an exemplary theoretical calculation illustrating the maximum thickness of a solidified silicon layer that may be achieved as a function of the mold temperature, $T_{Mold}$, at the time of immersion corresponding to mold thicknesses of 1 mm, 3 mm and 5 mm, as illustrated by squares, circles, and triangles, respectively. In the calculations, it was assumed that the mold is made of 100% dense (i.e., non-porous) vitreous silica and that the molten silicon is maintained at 1470° C. during immersion of the mold in the molten silicon. The graphs shown in FIG. 2 are generated by solving the energy balance equation below for the given mold material's physical properties. The maximum thickness of solidified silicon layer, Δ, formed while the mold is immersed in the molten semiconducting material can be expressed as a function (EQ. 1) of the mold density, $\rho_{Mold}$, the mold heat capacity, $Cp_{Mold}$, the temperature of the mold, $T_{Mold}$, at the time of immersion, the silicon melting temperature, $T_M$, the bulk temperature of the molten silicon, $T_S$, the thickness of the mold, W, the molten silicon density, $\rho_{Si}$, the specific heat capacity of molten silicon, $Cp_{Si}$, and the latent fusion heat of silicon, $\lambda_{Si}$:

$$\Delta = \frac{1}{2}\left[\frac{\rho_{Mold} Cp_{Mold} W(T_M - T_{Mold})}{\rho_{Si}\lambda_{Si} + \rho_{Si} Cp_{Si}(T_S - T_M)}\right]. \quad (EQ.\ 1)$$

Figure 4:
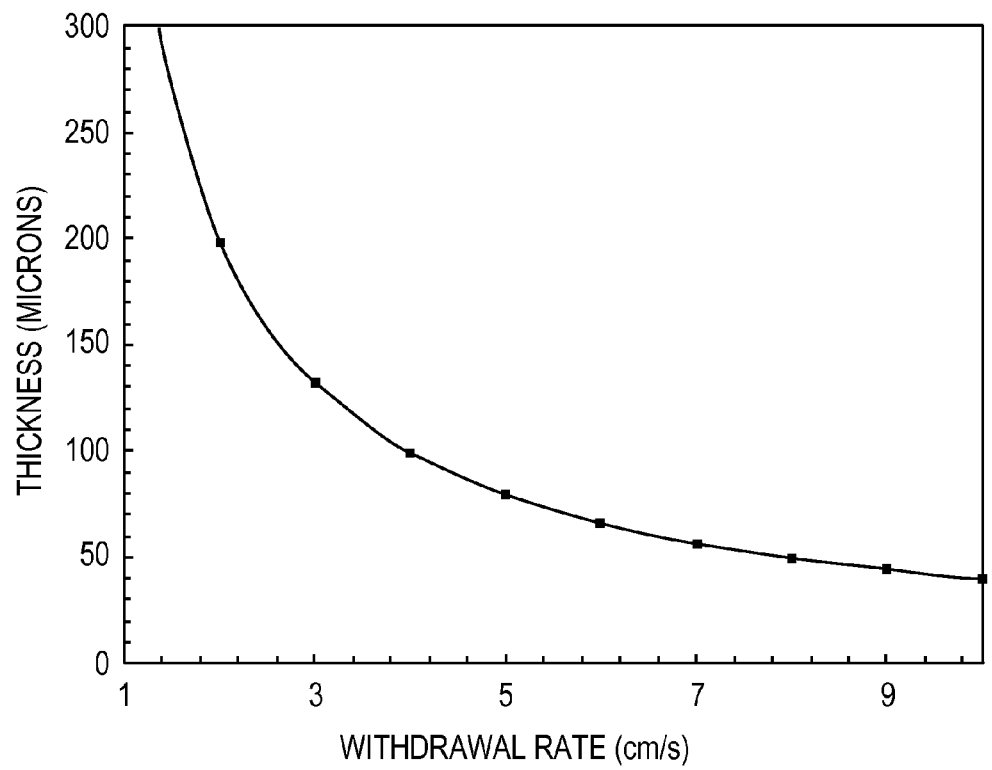
FIG. 4 is a graph illustrating the thickness of a drag layer of molten semiconducting material as a function of the rate at which the mold is withdrawn from the molten semiconducting material.

In addition to the thickness of semiconducting material contributed by the freezing/remelting of the semiconducting material over a surface of the mold, the thickness of the formed article of semiconducting material may also be affected by a drag layer that is formed when the mold 100 is withdrawn from the molten semiconducting material 104. Without wishing to be bound by theory, it is believed that the thickness added by the drag layer can be attributed to a combination of conventional dip-coating dynamics and additional freezing of the semiconducting material, which may depend on the rate at which mold 100 is withdrawn from molten semiconducting material 104. FIG. 4 shows a graphical representation of an exemplary calculation on the additional thickness of the final article produced as a function of the withdrawal rate of the mold from the molten semiconducting material. Thus, the thickness of the drag layer may decrease as the withdrawal rate is increased, as shown in FIG. 4. By way of example, in one embodiment where the mold is withdrawn at a rate ranging from 2 cm/s to 5 cm/s, the drag layer may contribute 100 μm to the thickness of the formed semiconducting material article.

Figure 3:
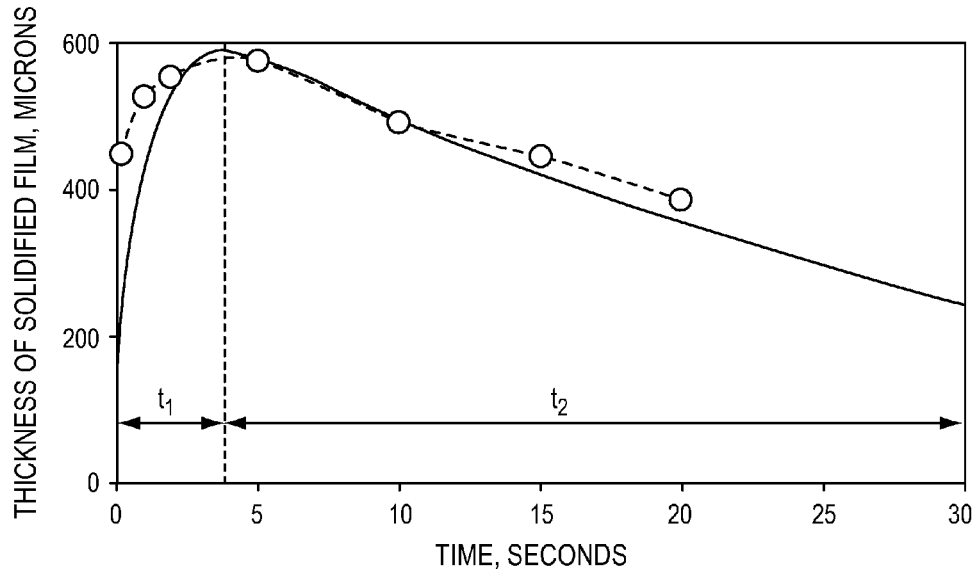
FIG. 3 is a graph illustrating the relationship between a thickness of a solid silicon layer formed on a mold and the immersion time of the mold in molten silicon according to an embodiment.

In at least one embodiment, the thickness of the resulting solid layer may be controlled by altering the immersion time of mold 100 in the molten semiconducting material 104. FIG. 3 shows a calculated graph of solidification distance (solid line), measured from the external surface 102 of mold 100, as a function of immersion time. The data of FIG. 3 is exemplary of one embodiment of the invention. One skilled in the art would appreciate that the time scale and/or thickness may vary depending on the operating parameters of the methods disclosed herein. FIG. 3 also shows a set of experimental data (dotted line with circles) corresponding to the processing conditions of the calculation. In at least some embodiments of the processes described herein, the solidified layer (e.g., silicon) initially rapidly grows to a maximum possible thickness, shown during time period $t_1$. The solidified layer may then thin during time period $t_2$ as the solid semiconducting material remelts back into the bulk molten first semiconducting material, which may be maintained at a predetermined temperature. Without wishing to be limited by theory, it is believed that during the initial phase (i.e., the beginning of the solidification phase), solidification is initiated at the mold-liquid interface followed by the progression of the solidification front into the liquid (i.e., the molten first semiconducting material), thereby leading to the formation and growth of a frozen layer of finite thickness. In the latter phase of the process when the heat capacity of the mold is exhausted, it is believed that remelting of the frozen layer takes place and the solid-liquid interface recedes towards the substrate wall. If the mold were left in the molten material, eventually all of the initially frozen layer would remelt as the mold thermally equilibrates with the melt. Assuming that the solidification rate is limited by the latent heat dissipation, the instantaneous velocity of the solid-liquid interface is given by the Stephan condition (EQ. 2):

$$K_S \frac{\partial T}{\partial x}\bigg|_S - K_L \frac{\partial T}{\partial x}\bigg|_L = v_i \rho_S \lambda \quad (EQ.\ 2)$$

where $K_S$ and $K_L$ are the thermal conductivities of the liquid and solid phase, $v_i$ is the instantaneous interface velocity, $\rho_S$ is the density of the solid phase and $\lambda$ the latent heat of fusion. The first and second terms on the left side of the equation are the heat fluxes through the solid and the liquid, respectively. If the heat flux through the solid is larger than the heat flux through the liquid, then the interface velocity is positive and the freezing continues. If the heat flux through the liquid is higher than the heat flux thorough the solid, the interface velocity is negative and remelting takes place. In at least one embodiment, the thickness of the article of semiconducting material is controlled by immersing the mold in the molten semiconducting material for a period of time such that for at least a portion of the immersion time the heat flux through the molten semiconducting material is higher than the heat flux through the solidified semiconducting material and remelting takes place. As can be determined from the data presented in FIG. 3, the rate at which remelting takes place is slower than the rate of the initial formation of the solid semiconducting material layer. It is believed that because of the slower rate of change in the thickness, the thickness of the formed article can be more accurately controlled during the remelting phase.

When the mold is immersed in the molten semiconducting material, during the solidifying phase, the heat flux through the solid phase (the first term on left hand side of the equation) is much larger than that in the initially isothermal liquid, and therefore rapid solidification into the liquid takes place. After a certain length of time, the heat flux through the liquid is higher than that through the solid, and remelting takes place. After a sufficient period of time has elapsed, the entire solidified layer of semiconducting material remelts and the mold thermally equilibrates with the melt.

It is believed that, in at least certain embodiments, the solidification phase starts at the mold-liquid interface, followed by the progression of solidification into the liquid from the mold. The dynamics of this process may be controlled by the rate of latent heat generation at the solidification interface and the conduction of the generated heat away from the interface. For solidification into a super-heated melt (i.e., where the temperature of the melt is greater than the melting point of the material), the temperature gradient ahead of the interface (i.e., in the direction of the melt) is expected to be positive. Therefore, the latent heat released at the solidifying/freezing front cannot be conducted or convected away into the melt. It is believed that the solidification dynamics are therefore set by the conduction of latent heat through the solidified semiconducting material into the mold (e.g., fused silica). The faster the conduction through the solidified semiconducting material and the mold, the faster is the solidification rate. Consequently, it is believed that the thermal properties of the mold have significant effect on the solidification dynamics. Conversely, it is believed that the temperature of the molten semiconducting material does not have much effect on the solidification phase. The solidification continues until the heat fluxes through the liquid (i.e., the molten semiconducting material) and the solid semiconducting material layer become equal. Beyond this point, the flux through the liquid is higher than that through the solid semiconducting material and remelting starts. During the remelting phase, latent heat is supplied to the interface from the superheated molten semiconducting material. Therefore, during the remelting phase, the properties of the molten semiconducting material have a greater effect on the remelting dynamics and the thermal properties of the mold do not have much effect.

According to at least one embodiment, the rate at which the mold is immersed into the molten semiconducting material may range from 1.0 cm/s to 50 cm/s, such as, for example, from 3 cm/s to 10 cm/s. One skilled in the art would recognize that the immersion rate may vary depending on various parameters, such as, for example, the semiconducting material composition (including optional dopants), the size/shape of the mold, the number and/or composition of the at least one discrete location, and the surface texture of the mold.

The rate at which the mold is withdrawn from the molten semiconducting material after immersion may also have an effect on the structure of the formed solid article. When the mold is withdrawn from the molten semiconducting material, a layer of molten semiconducting material may wet the surface of the solid layer of semiconducting material on the mold, which may add thickness to the solid layer of semiconducting material, as described above, and/or may change the surface structure of the solid layer of semiconducting material. In at least one embodiment, solid articles having smoother surfaces can be made using a relatively slow withdrawal rate of the mold from the molten material, such as, for example, 2 to 5 cm/s. When the mold is withdrawn too quickly, small local variations in heat removal may manifest as isolated solidification events that trap extra liquid within them, forming puddles and bumps. As these puddles and bumps rapidly solidify, they may form blobs and faceted peaks, sometimes several millimeters tall and up to one centimeter wide. It is believed that slower withdrawal confines the wetted area to the liquid-solid-gas interface and puts a continuous secondary smooth layer on the surface of the solid layer. Furthermore, quickly moving or accelerating the mold may induce flow patterns and even turbulence in the melt. The coupling between flow motion and heat transfer may cause pattern formation on the solidified surface of the article. In at least one embodiment, an article of semiconducting material is made by withdrawing the mold at a rate such that a secondary smooth layer is formed on the surface of the solid semiconducting material layer.

A person skilled in the art would recognize that the immersion rate, immersion time, and withdrawal rate may all affect the produced article and that those parameters may be chosen based on the desired article, the material/shape/texture/size of the mold, the starting temperature of the mold, the temperature of the molten semiconducting material, and the properties of the semiconducting material.

Returning to FIG. 1, in at least one embodiment vessel 106, which holds the molten semiconducting material 104, may not react with the molten semiconducting material 104 and/or may not contaminate the molten semiconducting material 104, as described above for mold 100. In at least one embodiment, vessel 106 may be made from a material chosen from vitreous silica, graphite, and silicon nitride. In at least one embodiment, vessel 106 is made of vitreous silica.

Without wishing to be limited, it is believed that in at least certain embodiments, the use of vitreous silica for the mold 104 and/or vessel 106 may lead to oxygen contamination of the article of semiconducting material. Thus, in various embodiments, oxygen contamination may optionally be mitigated or substantially mitigated, such as by melting the semiconducting material and casting the article in a low-oxygen environment, such as, for example, a dry mixture of hydrogen (<1 ppm of water) and an inert gas such as argon, krypton or xenon. In at least one exemplary embodiment, the atmosphere may be chosen from an Ar/1.0 wt % $H_2$ mixture or Ar/2.5 wt % $H_2$ mixture.

In at least one embodiment, the disclosed method may be used to make a sheet of semiconducting material, such as, for example, a silicon sheet, having a surface area, geometry, thickness, and grain structure within the range of usefulness for photovoltaic applications, for example a size up to approximately 156 mm×156 mm, thickness in a range of 100 μm to 400 μm, and a substantial number of grains larger than 1 mm. According to one embodiment, at least 60% of the grains may be larger than 1 mm. In a further embodiment, at least 80% or at least 90% of the grains may be larger than 1 mm. In at least one embodiment, the grains are two to three times greater in size in their narrowest lateral direction than they are thick.

In at least one embodiment, the disclosed methods yield articles of semiconducting material have improved grain structure, reduced amounts of impurities, at an improved rate and/or having a reduction in wasted material. For example, the exocasting processes described herein can be performed with essentially no waste of semiconducting elements, since all the melted material can be cast into a useful article. Any broken pieces or other unused material can be remelted and cast again. In at least one embodiment, immersion cycle times (i.e., the sum of time to immerse the mold, the immersion time, and the time to withdraw the mold) of less than 5 seconds are used to form sheets 7 cm in length (independent of width), which translates to a process speed of a few centimeters per second.

Unless otherwise indicated, all numbers used in the specification and claims are to be understood as being modified in all instances by the term "about," whether or not so stated. It should also be understood that the precise numerical values used in the specification and claims form additional embodiments of the invention. Efforts have been made to ensure the accuracy of the numerical values disclosed herein. Any measured numerical value, however, can inherently contain certain errors resulting from the standard deviation found in its respective measuring technique.

It is noted that, as used in this specification and the appended claims, the singular forms "a," "an," and "the," include plural referents unless expressly and unequivocally limited to one referent, and vice versa. Thus, by way of example only, reference to "a heat source" can refer to one or more heat sources, and reference to "a semiconducting material" can refer to one or more semiconducting materials. As used herein, the term "include" and its grammatical variants are intended to be non-limiting, such that recitation of items in a list is not to the exclusion of other like items that can be substituted or added to the listed items.

It will be apparent to those skilled in the art that various modifications and variation can be made to the programs and methods of the present disclosure without departing from the scope its teachings. Other embodiments of the disclosure will be apparent to those skilled in the art from consideration of the specification and practice of the teachings disclosed herein. It is intended that the embodiments described in the specification be considered as exemplary only.

We claim:

1. A method of making an article of a semiconducting material, comprising:
   providing a molten first semiconducting material at a temperature $T_s$;
   providing a mold at a temperature $T_{Mold}$, such that $T_{Mold} < T_s$, wherein the mold comprises a principle substrate having an external surface and at least one discrete location;
   coating the at least one discrete location with particles of a semiconducting material, the particles being substantially the same semiconducting material as the molten semiconducting material;
   immersing the mold in the molten semiconducting material for a period of time sufficient to form a solid layer at least partially comprised of the first semiconducting material over the external surface of the mold;
   withdrawing the mold with the solid layer from the molten semiconducting material; and
   optionally separating the solid layer from the mold.

2. The method of claim 1, wherein the molten semiconducting material and the particles comprise a semiconducting material selected from the group consisting of silicon, alloys and compounds of silicon, germanium, alloys and compounds of germanium, gallium arsenide, alloys and compounds of gallium arsenide, alloys and compounds of tin, and mixtures thereof.

3. The method of claim 1, wherein coating the at least one discrete location of the mold with particles of a semiconducting material comprises exposing the mold to fumes above the molten first semiconducting material for a period of time sufficient to form particles generated by the molten first semiconducting material on the at least one discrete location.

4. The method of claim 3, wherein the mold is situated above the molten first semiconducting material and exposed to fumes of the molten first semiconducting material before the mold is immersed in the molten first semiconducting material, and/or is exposed to fumes of the molten first semiconducting material as the mold is immersed in the molten first semiconducting material.

5. The method of claim 1, wherein coating the at least one discrete location of the mold with particles of a semiconducting material comprises spraying, rubbing, brushing, printing, pouring, dip-coating, chemical vapor deposition, physical vapor deposition, plasma enhanced chemical vapor deposition, or plasma induction deposition of the particles on the at least one discrete location.

6. The method of claim 1, wherein the particles have an average size ranging from 0.5 nm to 100 μm.

7. The method of claim 1, wherein the coating of particles has a thickness ranging from 0.5 nm to 100 μm.

8. The method of claim 1, wherein an atmosphere above the molten first semiconducting material comprises argon and hydrogen.

9. The method of claim 1, wherein providing the mold at a temperature $T_{Mold}$ comprises a step of heating the mold above the molten first semiconducting material.

10. A method of making an article of a semiconducting material, comprising:
    providing a molten first semiconducting material at a temperature $T_s$;
    providing a mold at a temperature $T_{Mold}$, such that $T_s > T_{Mold}$, wherein the mold comprises a principle substrate having opposing external surfaces and at least one discrete location of a second semiconducting material;
    immersing the mold in the molten first semiconducting material for a period of time sufficient to form solid layers at least partially comprised of the first semiconducting material over the external surfaces of the mold;
    withdrawing the mold with the solid layers from the molten first semiconducting material; and
    optionally separating the solid layers from the mold, wherein the first semiconducting material is substantially the same as the second semiconducting material.

11. The method of claim 10, wherein one or both of the first semiconducting material and the second semiconducting material are selected from the group consisting of silicon, alloys and compounds of silicon, germanium, alloys and compounds of germanium, gallium arsenide, alloys and compounds of gallium arsenide, alloys and compounds of tin, and mixtures thereof.

12. The method of claim 10, wherein the principle substrate comprises monocrystalline or multicrystalline silicon having an oxidized coating and the second semiconducting material is silicon.

13. The method of claim 12, wherein the at least one discrete location is formed by etching the oxidized coating.

14. The method of claim 10, wherein the at least one discrete location comprises a coating of particles of the second semiconducting material.

15. The method of claim 14, wherein the coating of particles of the second semiconducting material is formed by exposing the mold to fumes above the molten first semiconducting material for a period of time sufficient to form particles generated by the molten first semiconducting material on the at least one discrete location.

16. The method of claim 14, wherein the particles of the second semiconducting material have an average size ranging from 0.5 nm to 100 μm.

17. The method of claim 10, wherein providing the mold at a temperature $T_{Mold}$ comprises a step of heating the mold above the molten first semiconducting material.

18. A method of reducing the amount of impurities and/or defects and/or controlling the grain structure of an article of a semiconducting material during formation of the article, comprising:

providing a molten first semiconducting material at a temperature $T_s$;

providing a mold at a temperature $T_{Mold}$, such that $T_s > T_{Mold}$, wherein the mold comprises a principle substrate having an external surface and at least one discrete location comprised of a second semiconducting material;

immersing the mold in the molten first semiconducting material for a period of time sufficient to form a solid layer at least partially comprised of the first semiconducting material over an external surface of the mold and begin to remelt;

withdrawing the mold with the solid layer from the molten first semiconducting material; and optionally separating the solid layer from the mold, wherein the first semiconducting material is substantially the same material as the second semiconducting material.

19. The method of claim 18, wherein the first semiconducting material is chosen from silicon, alloys and compounds of silicon, germanium, alloys and compounds of germanium, gallium arsenide, alloys and compounds of gallium arsenide, alloys and compounds of tin, and mixtures thereof.

20. The method of claim 18, wherein providing the mold at a temperature $T_{Mold}$ comprises a step of heating the mold above the molten first semiconducting material.

* * * * *